United States Patent
Gogl et al.

(10) Patent No.: US 7,313,043 B2
(45) Date of Patent: Dec. 25, 2007

(54) MAGNETIC MEMORY ARRAY

(75) Inventors: Dietmar Gogl, Essex Junction, VT (US); Daniel Braun, Paris (FR)

(73) Assignees: Altis Semiconductor SNC, Essonnes Cedex (FR); Infineon Technologies AG, Munich (DE)

( * ) Notice: Subject to any disclaimer, the term of this patent is extended or adjusted under 35 U.S.C. 154(b) by 121 days.

(21) Appl. No.: 11/288,494

(22) Filed: Nov. 29, 2005

(65) Prior Publication Data

US 2007/0121391 A1    May 31, 2007

(51) Int. Cl.
G11C 7/02 (2006.01)
G11C 5/08 (2006.01)
G11C 11/00 (2006.01)
G11C 11/14 (2006.01)
G11C 11/15 (2006.01)

(52) U.S. Cl. ........................ 365/210; 365/66; 365/158; 365/171; 365/173; 365/207; 365/209; 365/214

(58) Field of Classification Search .................. 365/66, 365/158, 171, 173, 207, 214, 209, 210
See application file for complete search history.

(56) References Cited

U.S. PATENT DOCUMENTS

| | | | |
|---|---|---|---|
| 5,933,366 A * | 8/1999 | Yoshikawa | 365/185.03 |
| 6,341,081 B2 * | 1/2002 | Kang | 365/145 |
| 6,531,723 B1 | 3/2003 | Engel et al. | |
| 6,538,940 B1 * | 3/2003 | Nahas et al. | 365/201 |
| 6,545,906 B1 | 4/2003 | Savtchenko et al. | |
| 6,625,076 B2 * | 9/2003 | Weber et al. | 365/207 |
| 6,760,269 B2 * | 7/2004 | Nakase et al. | 365/210 |
| 2002/0172073 A1 * | 11/2002 | Hidaka | 365/158 |

* cited by examiner

*Primary Examiner*—Ly Duy Pham
(74) *Attorney, Agent, or Firm*—Dicke, Billig & Czaja PLLC

(57) ABSTRACT

A magnetic memory is disclosed. In one embodiment, the magnetic memory array includes a plurality of cell columns and a pair of reference cell columns, including a first reference cell column and a second reference cell column. A comparator is provided with a first and a second input terminal. A switching circuit is configured to connect each of the cell columns to the first input terminal and the pair of reference cell columns coupled in parallel to the second input terminal, and configured to connect the first reference cell column to the first input terminal and the second reference cell column to the second input terminal.

23 Claims, 4 Drawing Sheets

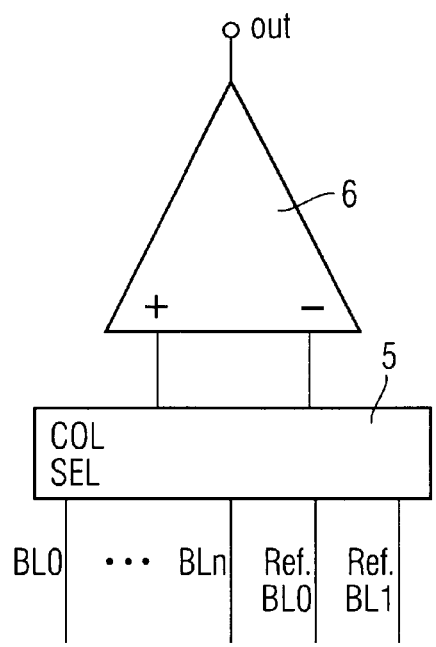
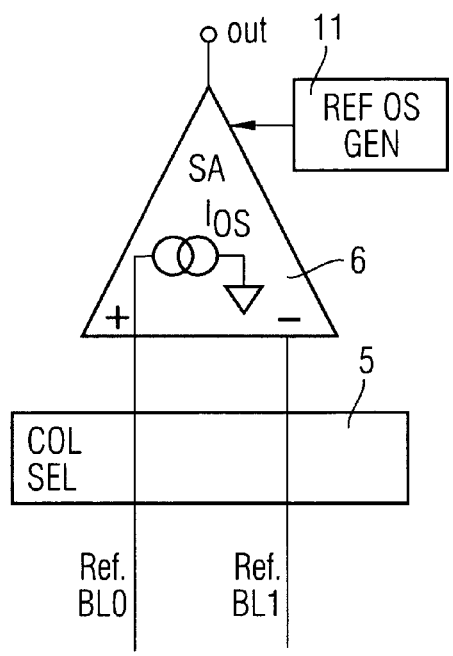
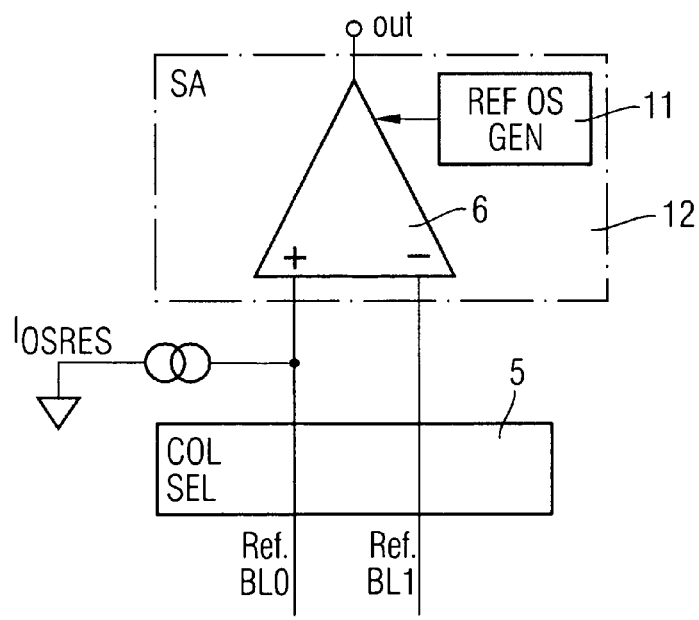

MAGNETIC MEMORY ARRAY

FIELD OF THE INVENTION

The present invention relates to non-volatile semiconductor memory chips and more particularly is concerned with a magnetoresistive random access memory array comprising magnetoresistive memory cells (MRAM cells) for use in a semiconductor integrated circuit.

BACKGROUND

In recent years, great efforts have been made to bring a new non-volatile memory technology based on magnetoresistive random access memory cells into commercial use. For further explaining a typical MRAM cell structure, reference is now made to FIG. 1.

A magnetoresistive memory cell includes a layered structure of ferromagnetic layers 1, 2 separated by a non-magnetic tunneling barrier 3 and arranged into a magnetic tunnel junction (MTJ). More specifically, magnetization of one ferromagnetic layer 2 ("reference layer") is magnetically fixed or pinned, while magnetization of the other ferromagnetic layer 1 ("free layer") is free to be switched between two preferred directions given by the same and opposite directions with respect to the fixed magnetization of the reference layer. Depending upon the magnetic states of the free layer 1, i.e. parallel or antiparallel states of its magnetization with respect to the magnetization of the reference layer 2, the magnetic memory cell exhibits two different resistance values $R_1$, $R_2$ in response to a voltage applied across the magnetic tunnel junction barrier. Thus, particular resistance of the memory cell reflects the magnetization states of the free layer, wherein resistance is low when the magnetization is parallel and high when the magnetization is antiparallel ($R_1 < R_2$). Hence, detection of resistance values allows to provide a logic zero ("logic low") or a logic one ("logic high") state information stored in the magnetic memory cell.

Conventionally, an MRAM cell is written to through the application of magnetic fields created by bidirectional currents ($I_{WWL}$, $I_{BL}$) flowing through dedicated current lines, typically bit lines (BL) and write word lines (WWL) crossing at right angles with the memory cells each being positioned at an intersection thereof. If a magnetic field in the direction opposite to the magnetization direction of the free layer is applied, then the magnetic moment vector of the free layer is reversed in case a critical magnetic field value is reached, which is also referred to as reversal magnetic field. Assuming that a magnetic field applied to the direction of the magnetization hard axis is represented by $H_y$ and a magnetic field applied to the direction of the easy axis thereof is represented by $H_x$, then a relationship $H_x^{(2/3)} + H_y^{(2/3)} = H_c^{(2/3)}$ is established, where $H_c$ represents the anisotropic magnetic field of the free layer. Since this curve forms an astroid on a $H_x$-$H_y$-plane, it is called astroid curve. As can be seen from above relationship, a composite synthetic magnetic field enables the selection of a single MRAM cell in case the sum of both magnetic fields at least amounts to the reversal magnetic field. Based upon the above, the well-known "Stoner-Wohlfahrt"-switching scenario is typically used for switching MRAM-cells.

For the design of fast MRAM memories, each MTJ typically is combined with one select transistor ST in a single ended configuration, as shown in FIG. 2. At writing, current is applied to the bit line BL and the write word line WWL to generate a synthetic magnetic field at a cell position of interest so as to control the direction of magnetization of the free layer in the MTJ. At reading, voltage is applied to read word line RWL to render select transistor ST conductive. Current is then provided from bit line BL to the current sink GND via the MTJ and a conductive path that is comprised of plural conductive structures (MX, VX, . . . ) and select transistor ST. Here, the magnitude of the flowing current varies depending on the direction of the free layer magnetization with respect to the reference layer magnetization.

Reference is now made to FIG. 3 for further explaining read operation of memory cells in a basic 1-Transistor-1-MTJ-(1T1MTJ) configuration of memory cells in a typical array of MRAM cells. In such memory cell array having a plurality of bit lines and a plurality of word lines crossing in right angles, in single ended configurations, a plurality of memory cell columns are formed. In each of such memory cell columns, a bit line connects a memory cell and a select transistor, as exemplified by memory cell 4 being series connected to select transistor ST via bit line BL. More specifically, a first end of each of the memory cells is connected to the BL and a second end thereof is connected to the current path of the select transistor ST which may be rendered conductive applying voltage to the read word line RWL connected to the control gate thereof.

In such array of memory cells, apart from the memory cell columns, reference cell columns are provided comprising reference cells that are physically identical to the memory cells and are arranged in a same single ended configuration to form cell columns such as the memory cells but are not intended for user programming but for holding logic values to provide a reference current ("dummy cells"). Memory cells and reference cells the control gates of select transistors of which are connected by a single word line (RWL) form a sub-array of the MRAM array.

Further, cell column selector 5 is used to connect both reference cell columns and to select and connect each of the memory cell columns to a differential sense amplifier (SA) 6 having three different inputs, one for each of the memory cell columns and two for both reference cell columns. Differential sense amplifier 6 comprising comparator 7 is for sensing of logic states that is to say resistivity values of the cells connected therewith, wherein each of the selected memory cell columns as well as reference cell columns typically is kept at a constant potential by means of bit line clamping transistors 9. For sensing of resistivity values of the memory cells, bit line clamping transistor 9 that may be connected to each of the memory cells is connected to one input (e.g. "+"—input) of comparator 7 with both reference cell columns comprising reference cells ("ref. cell 1" and "ref. cell 0" in FIG. 3) that are coupled in parallel being connected to another input (e.g. "−"—input) of comparator 7. Furthermore, two load devices 8 are provided, one of which being series connected to the current path of the bit line clamping transistor that may be series connected to each of the memory cells, while the other one being series connected to the current path of the parallely coupled bit line clamping transistors of the reference cells. More particularly, being kept at a constant potential by means of bit line clamping transistors 9, current of the cell columns flows through load devices 8 to create a potential value on the inputs of comparator 7.

In order to be used as reference cell, as is conventional, one of the reference cells has to be programmed to a logic high state such as a logic one state and the other reference cell has to be programmed to a logic low state such as a logic zero state. Thus, due to parallel coupling of the reference columns, an averaged signal of the logic values "high" and "low" can be obtained at the "−"—input of the sense amplifier to be used as reference signal. This allows to determine resistivity values that is to say logic values of the selected memory cells comparing signals of both inputs of the comparator 7, the result of which comparison is given at output (out) of the sense amplifier 6.

Accordingly, as above-outlined, for determining logic states of the selected memory cells, reference cells have to be programmed in a way that one cell is in a state representing a logic high value while the other cell is in a state representing a logic low value to thereby obtain an averaged reference signal. This has to be done for every pair of reference cells for each RWL of every sub-array of the MRAM array as above-described in structural aspects.

Usually programming of reference cells into defined logic states is not a problem as the state of a reference cell is exactly defined by the WWL and BL programming currents. Even if the initial state of the reference cell is not known, applying the WWL and BL currents with the right current directions will result in the desired logic high or low states of the targeted reference cell.

However, this situation is not true in a memory array based on rotational switching memory cells ("toggle cells"), that have been proposed as a new concept of memory cells in recent years. More specifically, in any rotational switching cell, the free layer is designed to be a layered stack of ferromagnetic free layers that are antiferromagnetically coupled with each other, where the number of antiferromagnetically coupled layers may be appropriately chosen to increase the effective magnetic switching volume of the MRAM device. See, for example, U.S. Pat. No. 6,531,723 B1 to Engel et al., the disclosure of which is incorporated herein by reference.

For the switching of such memory cells another switching scenario, the so-called "adiabatic rotational (toggle) switching" (see for instance U.S. Pat. No. 6,545,906 B1 to Savtchenko et al.) typically is used. In short, adiabatic rotational switching relies on the "spin-flop" phenomenon, which lowers the total magnetic energy in an applied magnetic field by rotating the magnetic moment vectors of the antiferromagnetically coupled ferromagnetic free layers. More specifically, assuming that a bit line magnetic field $H_{BL}$ and a write word line magnetic field $H_{WWL}$ respectively arrive at the MRAM cell for its switching, and that antiferromagnetically coupled magnetic moment vectors $M_1$ and $M_2$ exhibited by the ferromagnetic free layers are inclined at a 45° angle to the word and bit lines, respectively, a timed switching pulse sequence of applied magnetic fields in a typical "toggling write" mode is at follows: at a time $t_0$ neither a write word line current nor a bit line current are applied resulting in a zero magnetic field $H_0$ of both $H_{BL}$ and $H_{HWL}$. At a time t1, the write word line current is increased to $H_1$ and magnetic moment vectors $M_1$ and $M_2$ begin to rotate either clockwise or counter-clockwise, depending on the direction of the write word line current. At a time $t_2$, the bit line current is switched on, where it is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being nominally orthogonal to the net magnetic field direction, which is 45° with respect to the current lines. At a time $t_3$, the word line current is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state.

Accordingly, with regard to the magnetic moment vector of the reference layer, the MRAM cell has been switched from its parallel state into its anti-parallel state, or vice versa, depending on the state switching ("toggling") starts off with.

Accordingly, applying WWL and BL programming currents to rotational switching cells, only toggling of the cell can be achieved. This is not a problem for the regular memory cells as their programming state can be determined by the sense amplifier of the memory chip. The cell can then be toggled or left unchanged depending on the desired programming state.

However, for the sense amplifier being able to read the actual state of the cell, preprogrammed reference cells are usually necessary. Hence, for the reference cells a problem occurs that their state has to be determined before they can be programmed into the desired state.

Basically, the state of the reference cells could be determined using a self-referencing sensing scheme. However, implementing a self-referencing sensing scheme into a high-speed sense amplifier is critical concerning performance and chip area.

SUMMARY

The present invention provides a magnetic memory array. In one embodiment, the magnetic memory array includes a plurality of cell columns and a pair of reference cell columns, including a first reference cell column and a second reference cell column. A comparator is provided with a first and a second input terminal. A switching circuit is configured to connect each of the cell columns to the first input terminal and the pair of reference cell columns coupled in parallel to the second input terminal, and configured to connect the first reference cell column to the first input terminal and the second reference cell column to the second input terminal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 4A-4C illustrate an embodiment of the invention.

DETAILED DESCRIPTION

Figure 1:
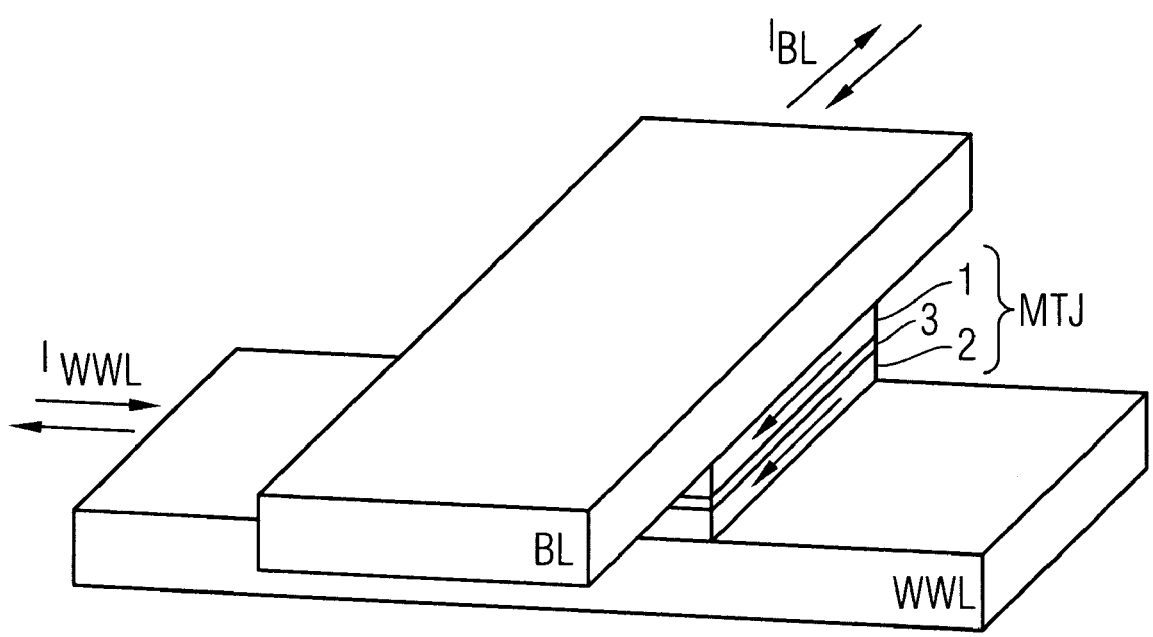
FIG. 1 illustrates schematically a stacked structure of a conventional MRAM element.
Figure 1:
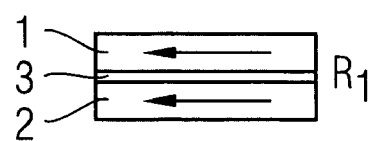
Figure 1:
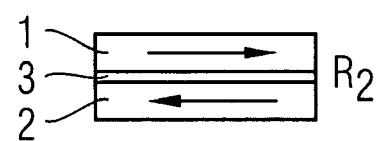

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the FIG(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a magnetoresistive random access memory cell. In one embodiment, the magnetoresistive random access memory cell array is given, which typically includes a plurality of current lines where each of which is series connected to a single one of the memory cells and a single control transistor having a control terminal in a single ended configuration to thereby form cell columns and wherein a pair of the cell columns is not used as memory cells for storing data but are provided as reference cell columns to provide reference signal outputs. It further includes a select line being series connected to the control terminals of the control transistors, and, an output circuitry having a comparator with a first and a second input terminal and switching circuitry adapted to connect each of the cell columns to the first input terminal and the pair of reference cell columns coupled in parallel to the second input terminal, so as to differentially compare output signals from the different cell columns. According to one embodiment of the invention, the switching means is further adapted to connect a first reference cell column of the pair of reference cell columns to the first input terminal and a second reference cell column of the pair of reference cell columns to the second input terminal. Upon doing so, both reference cells of the reference cell columns can advantageously be brought into a desired programming state. Such array of memory cells can also be identified as sub-array of a larger array of memory cells that is comprised of plural sub-arrays.

Further, the memory cells are magnetically coupled to conductive lines for creating synthetic magnetic fields for programming of the memory cells in a desired logic state. Conductive lines magnetically coupled to the memory cells may be identified by bit lines and write word lines typically crossing at right angles with the memory cells being positioned at an intersection thereof.

In one embodiment of the invention, the array of memory cells further comprises an offset current generation means connected to the output circuitry for applying a predetermined offset current thereto.

According to one embodiment of the invention, a method for programming rotational switching cells of reference columns in an array of magnetoresistive random access rotational switching memory cells as above-described includes connecting the first one of the reference cell columns to the first input terminal of the comparator and the second one of the reference cell columns to the second input terminal for sensing the logic states of the rotational switching connected therewith.

Currents are applied to the conductive lines magnetically coupled to the rotational switching cells of the reference columns for generating a synthetic magnetic field to perform at least one toggle switching of the rotational switching cells in response to an output of the output circuitry.

In one embodiment of the method, an offset current is applied to the output circuitry.

One embodiment of the present invention will be described in detail below with reference to the accompanying drawings, where like designations denote like elements.

Figure 2:
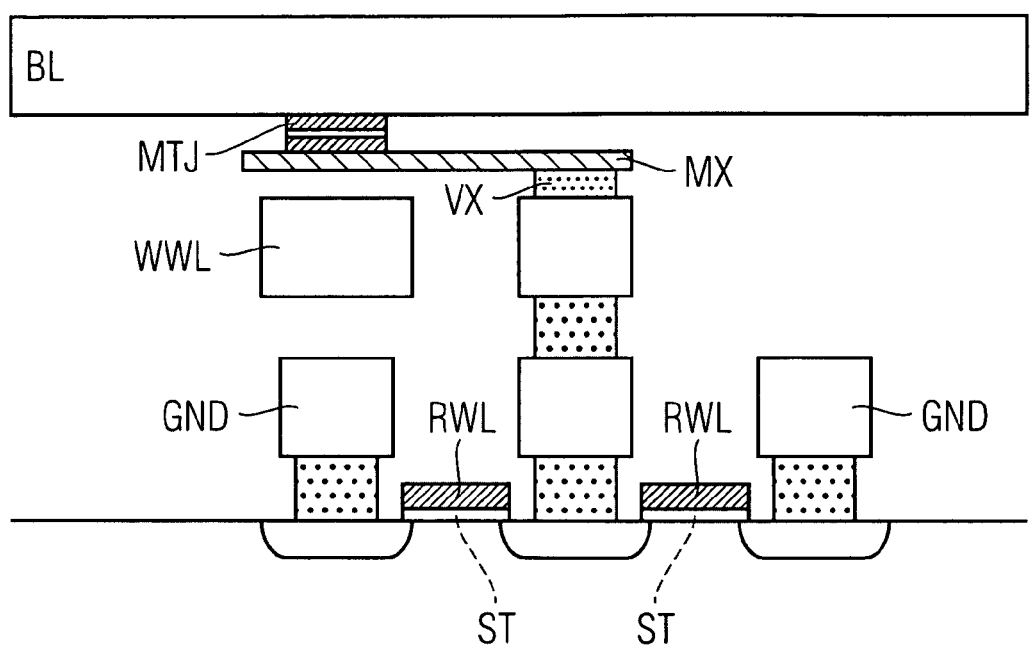
FIG. 2 depicts a conventional 1T-1MTJ-structure.
Figure 3:
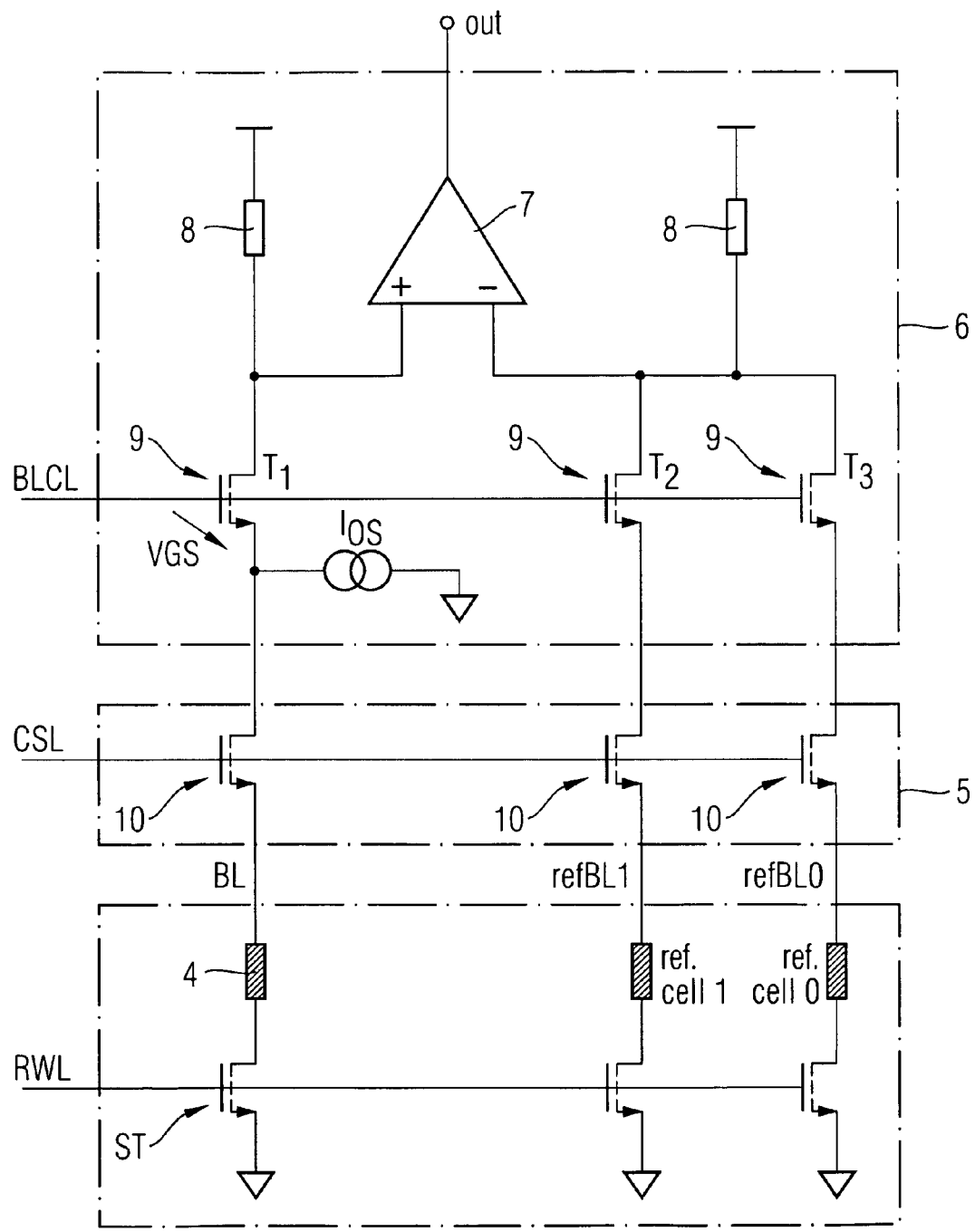
FIG. 3 illustrates a sub-array of a conventional MRAM array comprising a single ended configuration of bit lines.

FIGS. 1, 2 and 3 have already been described in the introductory portion, so that a further description thereof is omitted.

Now referring to FIGS. 4A through 4C, one embodiment of a memory cell array of the invention is explained based on a single ended configuration of bit lines as depicted in FIG. 3 to which reference is made. Accordingly, such configuration of memory cells is a basic 1-Transistor-1-MTJ-(1T1MTJ) configuration of memory cells in a typical array of MRAM cells. While not explicitly illustrated in FIGS. 4A through 4C, such memory cell array has a plurality of bit lines to form a plurality of memory cell columns (BL0 . . . BLn) with each bit line being series connected to a memory cell and a select transistor as illustrated in FIG. 3, wherein two memory cells are used as reference cells (Ref. BL0, Ref. BL1). A single read word line is connected to the control gates of the select transistors.

Further, cell column selector 5 is used to select and to connect each of the memory cell columns to a differential sense amplifier (SA) 6 that is illustrated to have two different inputs, a first input (e.g. "+") for each of the memory cell columns and a second input (e.g. "−") for both reference cell columns being coupled in parallel by column selector 5. FIG. 4A illustrates a situation, where one of the memory cell columns is connected to the "+"—input of the SA 6 and both reference cell columns being coupled in parallel are connected to the "−"— input of the SA 6. The SA 6 being provided with a comparator differentially comparing output signals from the different cell columns connected to both inputs of the SA 6, resistivity values that is to say logic states of the memory cells can be determined. Signals resulting from such determination can be obtained at the output (out) of the SA 6.

Reference is now made to FIGS. 4B and 4C. According to the invention, column selector 5 which is used as switching means for connecting memory cell columns to the one input of the SA 6 is further able to connect a first reference cell column of the pair of reference cell columns to the first input terminal and a second reference cell column of the pair of reference cell columns to the second input terminal of the SA 6. Connection of the reference bit lines with both inputs of the sense amplifier 6 is for sensing logic states of rotational switching cells used as reference cells.

In a first process to sense logic states of the reference cells, reference bit lines (Ref. BL0 and Ref. BL1) each are connected to the inputs of the sense amplifier 6.

However, the sense amplifier 6 may not be appropriate to determine logic states of the reference cells because both reference cells can be in a logic high or logic low state. Moreover there is also an input offset current $I_{OS}$ for a real sense amplifier which will result in a statistically unpredictable output signal.

It follows from this that the sense amplifier 6 has to be adjusted to a predictable systematic offset of a known sign and absolute value larger than the statistical offset of the sense amplifier. For this purpose, an offset current generator 11 connected to the sense amplifier 6 is provided to apply an offset current of appropriate sign and value to the sense amplifier 6 as shown in FIGS. 4B and 4C. Offset current generation means as such are well-known to those skilled in the art and need not be further detailed here.

Accordingly, in a second process to sense the logic states of the reference cells, offset current of appropriate sign and value is applied to the sense amplifier 6 to result in adjusted offset $I_{OSRES}$, as illustrated in FIG. 4C. FIG. 4C shows a situation where the offset current generator 11 and the SA 6 have been incorporated in single packaging 12.

Knowing that the sense amplifier 6 will produce a defined logic low state "0" or logic high state "1" at its output if both inputs are connected to memory cells of the same programming state allows the following exemplary procedure for programming a desired logic state of the reference cells. However, other procedures are also possible based on the fact that both reference cells can be connected to the inputs of the SA 6.

It is assumed that the sense amplifier 6 will produce a "0" if both reference cells have the same value (guaranteed because of $I_{OSRES}$). The sense amplifier 6 can also be designed that a "0" memory cell at its positive input and a "1" memory cell at its negative input also produces a "0" at its output. This results in the following signal table:

| Ref. Cell 0 | Ref. Cell 1 | Sense amplifier output |
|---|---|---|
| 0 | 0 | 0 |
| 0 | 1 | 0 |
| 1 | 0 | 1 |
| 1 | 1 | 0 |

If the sense amplifier output illustrates a "1", the state of the reference cells is determined. If the result is "0", a write operation is necessary at Ref. Cell 0. If the result is still "0", an additional write operation is necessary at Ref. Cell 1. If the result is still "0", the logic state of the reference cells is "0" both. Other similar algorithms are also possible on the hardware implementation as above-presented.

The method illustrated can be easily implemented, especially if a sense amplifier calibration is already available, which can also be used to generate sense amplifier offsets. Moreover the principle is easy enough to be implemented into a built-in initialization for example during power-up of the chip or built-in self test.

The array of memory cells as described in connection with FIGS. 4A through 4C typically can be identified as sub-array of an array of memory cells being comprised of such sub-arrays.

Obviously many modifications and variations of the present invention are possible in light of the above description. It is therefore to be understood, that within the scope of appended claims, the invention may be practiced otherwise than as specifically devised.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A magnetic memory array comprising:
   a plurality of cell columns;
   a pair of reference cell columns, including a first reference cell column and a second reference cell column;
   a comparator with a first and a second input terminal; and
   a switching circuit configured to connect each of the cell columns to the first input terminal and the pair of reference cell columns coupled in parallel to the second input terminal, and the switching circuit is further configured to connect the first reference cell column to the first input terminal and the second reference cell column to the second input terminal.

2. The memory array of claim 1, comprising:
   wherein the magnetic memory array comprises an array of magnetoresistive random access rotational switching memory cells.

3. The memory array of claim 1, comprising:
   a plurality of current lines each series connected to a single one of the memory cells and a single control transistor having a control terminal in a single ended configuration to form the cell columns.

4. The memory array of claim 3, comprising wherein a pair of the cell columns are provided as the pair of reference cell columns to provide reference signal outputs.

5. The memory array of claim 1, comprising:
   a select line being series connected to the control terminals of the control transistors.

6. The memory array of claim 1, comprising:
   an output circuit defined by the comparator and the switching circuit.

7. The memory array of claim 1, wherein the output circuit comprises a sense amplifier.

8. The memory array of claim 1, comprising:
   an offset current generation circuit configured to apply a predetermined offset current to the output circuit.

9. A magnetic memory array comprising:
   a plurality of cell columns;
   a pair of reference cell columns, including a first reference cell column and a second reference cell column; and
   an output circuit comprising a comparator with a first and a second input terminal, and a switching circuit configured to connect each of the cell columns to the first input terminal and the pair of reference cell columns coupled in parallel to the second input terminal, and configured to connect the first reference cell column to the first input terminal and the second reference cell column to the second input terminal.

10. The memory array of claim 9, wherein the output circuit comprises a sense amplifier.

11. The memory array of claim 10, comprising:
   an offset current generation circuit configured to apply a predetermined offset current to the output circuit.

12. The memory array of claim 11, comprising:
   wherein the magnetic memory array comprises an array of magnetoresistive random access rotational switching memory cells.

13. The memory array of claim 12, comprising:
   a plurality of current lines each series connected to a single one of the memory cells and a single control transistor having a control terminal in a single ended configuration to form the cell columns.

14. The memory array of claim 13, comprising wherein a pair of the cell columns are provided as the pair of reference cell columns to provide reference signal outputs.

15. The memory array of claim 14, comprising:

a select line being series connected to the control terminals of the control transistors.

16. An array of magnetoresistive random access rotational switching memory cells comprising:

a plurality of current lines each of which being series connected to a single one of the memory cells and a single control transistor having a control terminal in a single ended configuration to form cell columns, a pair of the cell columns being provided as reference cell columns to provide reference signal outputs;

a select line being series connected to the control terminals of the control transistors; and an output circuitry having a comparator with a first and a second input terminal and switching circuitry coonfigured to connect each of the cell columns to the first input terminal and the pair of reference cell columns coupled in parallel to the second input terminal, so as to differentially compare output signals from the different cell columns, the switching circuitry further being configured to connect a first one of the pair of reference cell columns to the first input terminal and a second one of the pair of reference cell columns to the second input terminal.

17. The magnetic random access memory array of claim 16, wherein said output circuitry is a sense amplifier.

18. The magnetic random access memory array of claims 16, further comprising:

an offset current generation means connected to the output circuitry for applying a predetermined offset current to the output circuitry.

19. A method for programming rotational switching cells of reference columns in an array of magnetoresistive random access rotational switching memory cells comprising:

connecting a first reference cell column to a first input terminal of a comparator and a second reference cell column to a second input terminal of the comparator for sensing logic states of the rotational switching cells connected therewith; and applying currents to conductive lines magnetically coupled to the rotational switching cells of the reference columns for generating a synthetic magnetic field to perform at least one toggle switching of the rotational switching cells in response to an output of an output circuitry.

20. The method of claim 19, further comprising:

applying an offset current to said output circuitry.

21. A method for programming rotational switching cells of reference columns in an array of magnetoresistive random access rotational switching memory cells comprising:

defining a plurality of current lines each of which being series connected to a single one of the memory cells and a single control transistor having a control terminal in a single ended configuration to form cell columns, a pair of the cell columns being provided as reference cell columns to provide reference signal outputs;

providing a select line being seriesly connected to the control terminals of the control transistors;

an output circuitry having a comparator with a first and a second input terminal and switching circuitry adapted to connect each of the cell columns to the first input terminal and the pair of reference cell columns coupled in parallel to the second input terminal, so as to differentially compare output signals from the different cell columns, the switching means further being configured to connect a first one of the pair of reference cell columns to the first input terminal and a second one of the pair of reference cell columns to the second input terminal;

connecting the first one of the reference cell columns to the first input terminal of the comparator and the second one of the reference cell columns to the second input terminal for sensing the logic states of the rotational switching cells connected therewith; and applying currents to conductive lines magnetically coupled to the rotational switching cells of the reference columns for generating a synthetic magnetic field to perform at least one toggle switching of the rotational switching cells in response to an output of the output circuitry.

22. The method of claim 21, further comprising:

applying an offset current to said output circuitry.

23. A magnetic memory array comprising:

a plurality of cell columns;

a pair of reference cell columns, including a first reference cell column and a second reference cell column;

means for comparing with a first and a second input terminal; and means for switching configured to connect each of the cell columns to the first input terminal and the pair of reference cell columns coupled in parallel to the second input terminal, and the means for switching is further configured to connect the first reference cell column to the first input terminal and the second reference cell column to the second input terminal.

* * * * *